United States Patent [19]

Olsson

[11] Patent Number: 5,046,955

[45] Date of Patent: Sep. 10, 1991

[54] ACTIVE CONNECTOR ASSEMBLY

[75] Inventor: Billy E. Olsson, New Cumberland, Pa.

[73] Assignee: AMP Incorporated, Harrisburg, Pa.

[21] Appl. No.: 462,263

[22] Filed: Jan. 9, 1990

[51] Int. Cl.$^5$ ............................................... H01B 9/09
[52] U.S. Cl. ......................................... 439/74; 439/76; 439/326; 439/636
[58] Field of Search .................. 439/59, 69, 74, 76, 439/78, 81, 83, 326, 329, 630, 636

[56] References Cited

U.S. PATENT DOCUMENTS

| | | | |
|---|---|---|---|
| 3,372,308 | 3/1968 | Noschese et al. | 439/62 |
| 3,848,952 | 11/1974 | Tighe, Jr. | 439/326 |
| 3,966,290 | 6/1976 | Little et al. | 439/74 |
| 4,084,874 | 4/1978 | Georgopulos | 439/326 |
| 4,206,962 | 6/1980 | Shue, Jr. et al. | 339/147 R |
| 4,575,172 | 3/1986 | Walse et al. | 439/329 |
| 4,603,320 | 7/1986 | Farago | 340/347 DD |
| 4,676,565 | 6/1987 | Reichardt | 439/83 |
| 4,686,650 | 8/1987 | Farago | 340/347 DD |
| 4,718,859 | 1/1988 | Gardner | 439/329 |
| 4,826,446 | 5/1989 | Juntwait | 439/326 |
| 4,992,052 | 2/1991 | Verhoeven | 439/636 |
| 4,993,956 | 2/1991 | Pickles et al. | 439/76 |

Primary Examiner—Paula A. Bradley
Attorney, Agent, or Firm—Allan B. Osborne

[57] ABSTRACT

An active connector assembly (10) for use in acting on electrical signals is disclosed. The assembly (10) includes a receptacle (14) for mounting on a printed circuit board (30), a pin header (12) for receiving signals from other data handling systems and a circuit card (16) attached electrically and mechanically along one edge (16a) to contact elements (26) in the pin header (12) and having an opposing edge (16b) for insertion into the receptacle (14) and electrical engagement with contact elements (28) therein.

5 Claims, 5 Drawing Sheets

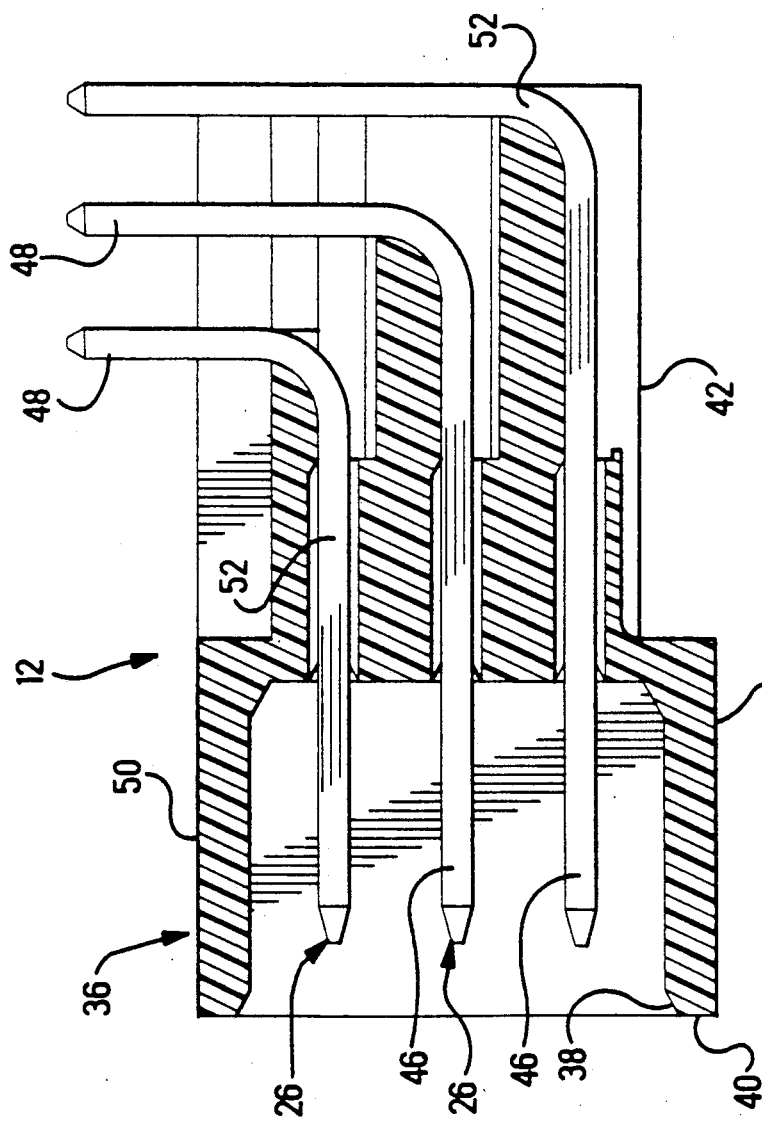
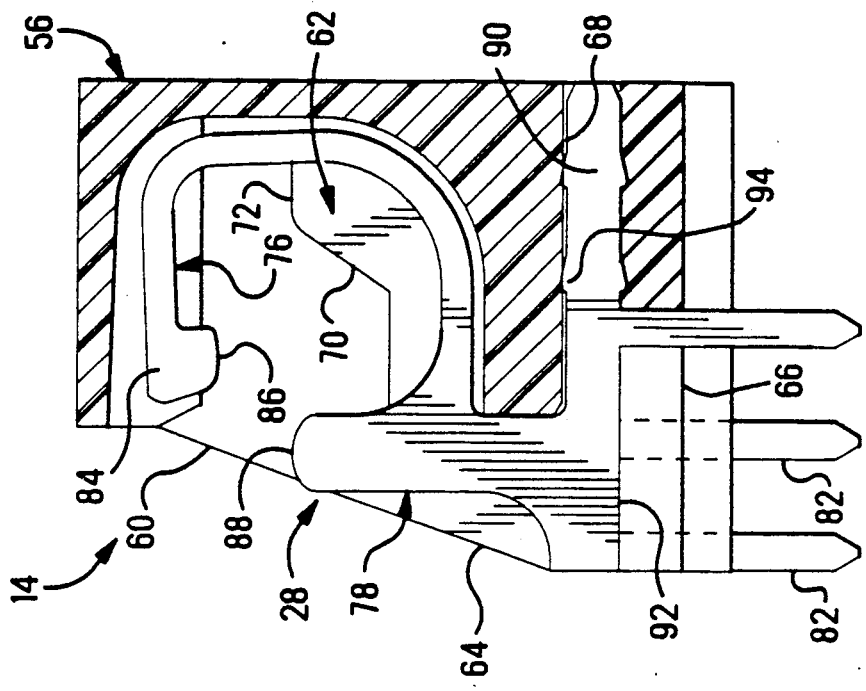
Figure 2A
Figure 2B

ACTIVE CONNECTOR ASSEMBLY

FIELD OF THE INVENTION

The invention disclosed herein relates to an electrical connector incorporating electronic components between arrays of input and output contact elements whereby the signals passing through the connector will be modified.

BACKGROUND OF THE INVENTION

It is known from prior art U.S. patents; e.g., U.S. Pat. Nos. 4,206,962, 4,603,320 and 4,686,506, to incorporate an electronic component within an electrical connector to act upon the signals passing therethrough. For example, the connector disclosed in U.S. Pat. No. 4,206,962 includes terminals at opposite ends of a housing with electronic devices positioned therebetween and electrically engaged with the respective terminals. The electronic devices may include integrated circuit chips, resistors and the like for modifying electrical signals. Whereas electronic components can be replaced in the connector of '962, the replaced components must be compatible with the terminals.

U.S. Pat. No. 4,603,320 discloses a similar connector wherein the electronic component, which converts incoming data from one format to another before being routed onto a second data handling system, are mounted on a printed circuit board. In this known connector, however, the circuit board is fixed as an integral part of the connector and accordingly the electronic components cannot be replaced.

Accordingly, it is now proposed to provide an assembly containing an easily removable circuit card and/or the electronic components thereon.

SUMMARY OF THE INVENTION

According to the invention an active connector assembly is provided wherein a circuit card is attached along one edge to a pin header and another edge is adapted to be removably inserted into electrical engagement with spring arms on contact elements in a receptacle.

BRIEF DESCRIPTION OF THE DRAWINGS

FIG. 2A is a section view of the pin header of the assembly;

FIG. 2B is a section view of the receptacle of the assembly;

DESCRIPTION OF THE INVENTION

Figure 1:
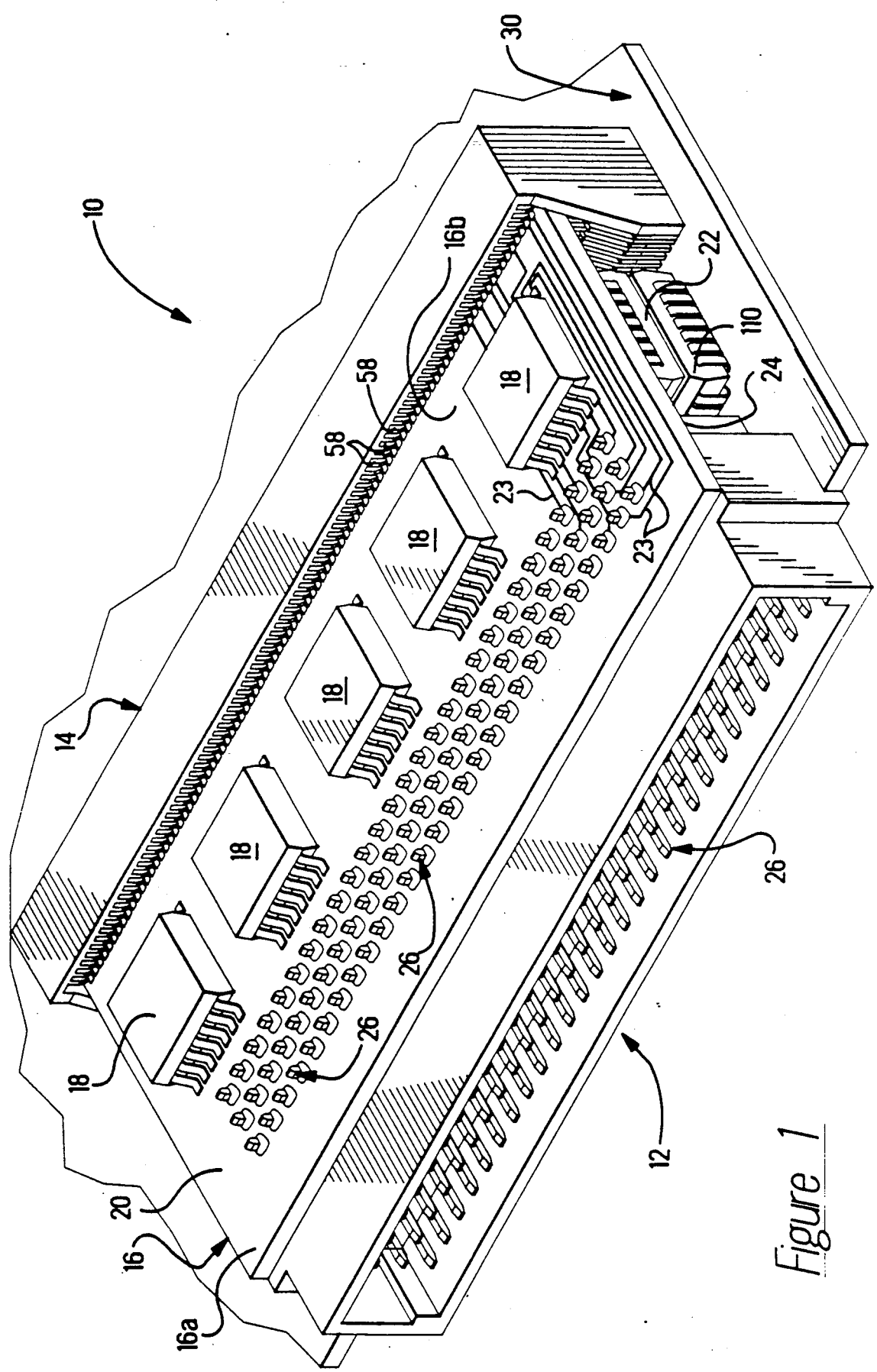
FIG. 1 is a perspective view of the active connector assembly of the present invention.

Active connector assembly 10 as shown in FIG. 1 includes pin header 12 receptacle 14 and printed circuit card 16. Electronic components 18 are mounted on surface 20 of card 16 and electronic components 22 are mounted on reverse surface 24.

Circuit card 16 is fixed to header 12 along card edge 16a while opposing card edge 16b is removably inserted into receptacle 14. Contact elements 26 in header 12 and contact elements 28 (FIG. 2B) in receptacle 14 are electrically connected to components 18,22 and to each other through traces or circuits 23 on card 16.

Assembly 10 is shown mounted on circuit board 30 with header 12 providing electrical access to external data handling systems (not shown).

Pin header 12, as shown in FIG. 2A, includes dielectric housing 36 and the aforementioned contact elements 26. Housing 36 is provided with an outwardly open shroud 38 at end 40 and a recess 42 on side 44.

Contact elements 26 include pins 46 which project into shroud 38, leads 48 which project outwardly from side 50 of housing 36 and L-shaped intermediate sections 52 which interconnect respective pins 46 and leads 48. Sections 52 vary in length as shown to provide the desired spacing of elements 26 in housing 36.

Contact elements 26, which are stamped from a suitable material such as brass or phosphor bronze, are pressed into pin header 12 and bent to the ninety degree shape shown. The preferred material used in molding header 12 is a plastics material sold by General Electric under the trademark VALOX 420 SEO.

Three rows of elements 26 are shown; however, more or less rows may be provided as required by a given application.

Receptacle 14, as shown in FIG. 2B, includes dielectric housing 56 and the aforementioned contact elements 28.

Housing 56 includes a plurality of cavities 58 which are defined by end walls 60 and spaced-apart cam walls 62. Cavities 58 open into front face 64 and base surface 66 and include passages 68 which are located above base surface 66.

Cam walls 62 include ramp 70 and upwardly facing surface 72. As shown in FIG. 1, cam walls 62 extend longitudinally along housing 56 and, as shown in FIG. 2B, only partially upwardly in cavities 58.

Contact elements 28 include C-shaped spring arm 76, intermediate section 78, and leads 82. An enlarged free end portion 84 of spring arm 76 carries edge-wise contact surface 86 which faces into the space defined by the curvature of arm 76.

Intermediate section 78 supports spring arm 76 to which it is attached and also includes a rounded fulcrum 88 at an upper free end thereof. Intermediate section 78 further includes mounting arm 90 adjacent lower edge 92. Arm 90 projects outwardly and includes barbs 94.

Leads 82 are attached to lower edge 92 of section 78 and extend outwardly therefrom. Leads 82 on adjacent elements 28 are spaced along edge 92 to accommodate the close circuitry (not shown) on circuit board 30.

Contact elements 28, which are preferably stamped and formed from phosphor bronze or beryllium copper, are loaded into respective cavities 58 with retention being by mounting arm 90 being frictionally received in passage 68. Leads 82 extend outwardly from base surface 66 for mounting onto circuit board 30.

Figure 3:
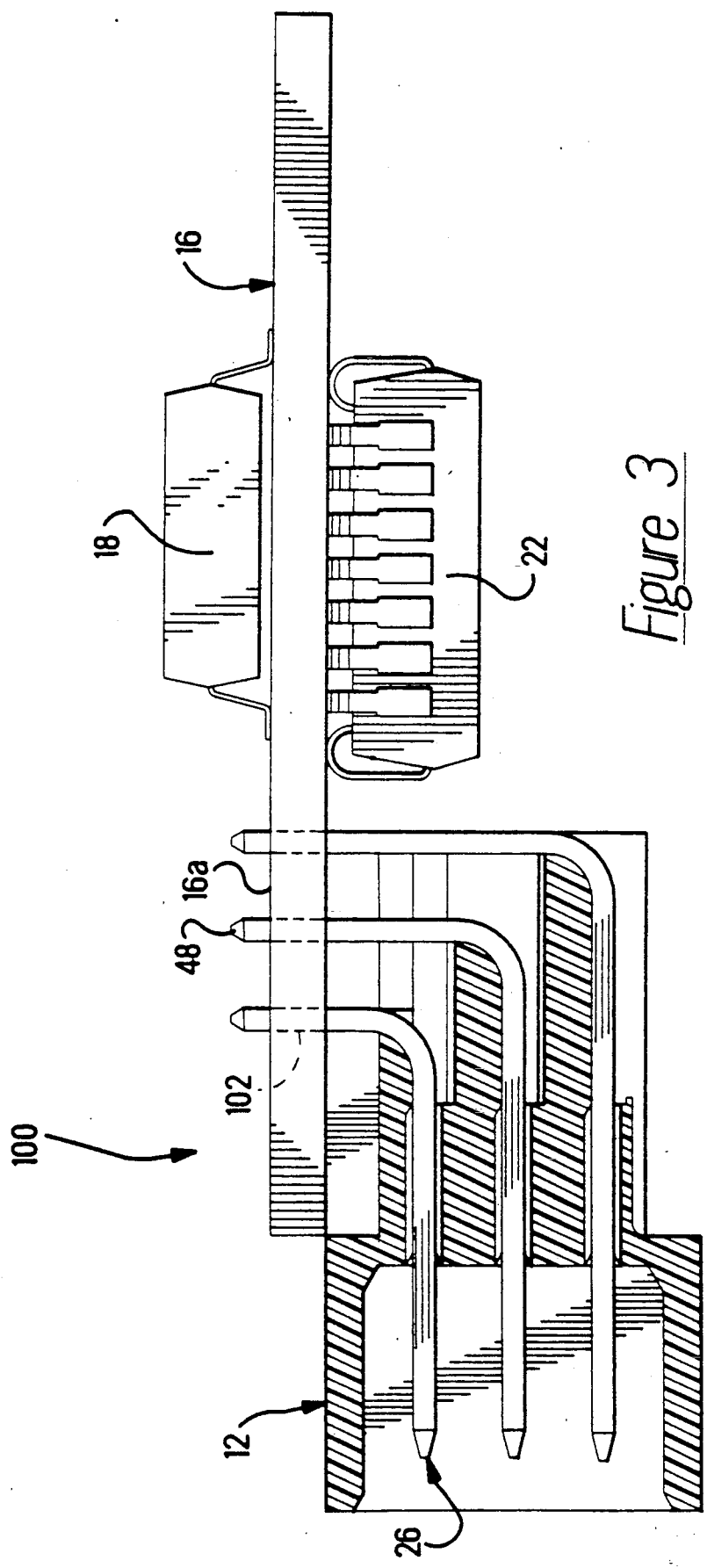
FIG. 3 is a partly sectioned view of a unit of the assembly formed by the pin header and a circuit card.

Active connector assembly 10 includes unit 100 shown in FIG. 3. Unit 100 includes pin header 12 with circuit card 16 attached thereto by means of leads 48 on contact elements 26 being soldered in holes 102. Alternatively, leads 48 could include a compliant mounting section (not shown) and be frictionally received in holes 102.

Figure 4:
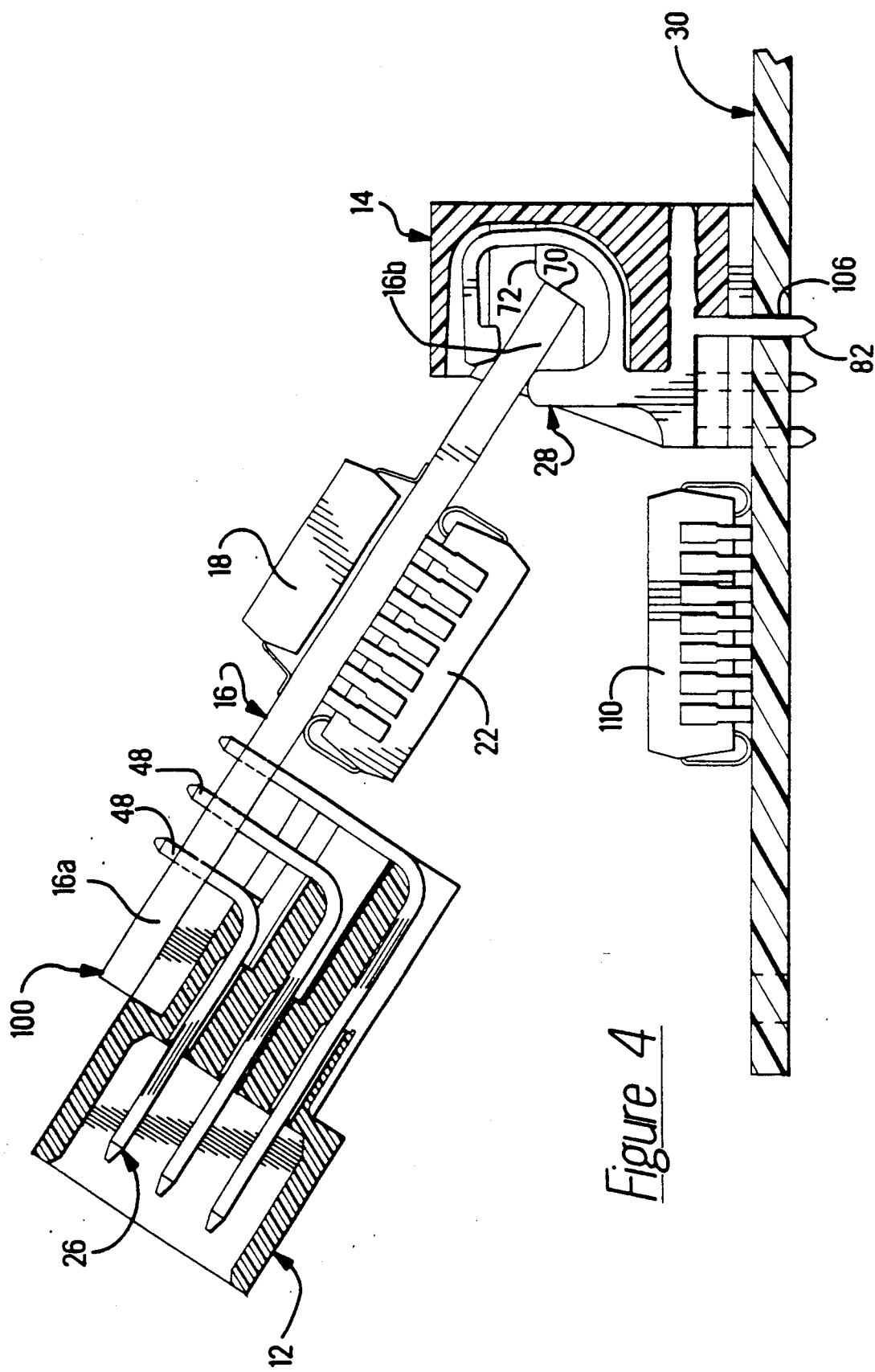
FIG. 4 shows the receptacle mounted on a circuit board and the unit of FIG. 3 being inserted thereinto.

As shown in FIG. 4, receptacle 14 is mounted on circuit board 30 with leads 82 being soldered in holes 106.

Figure 5:
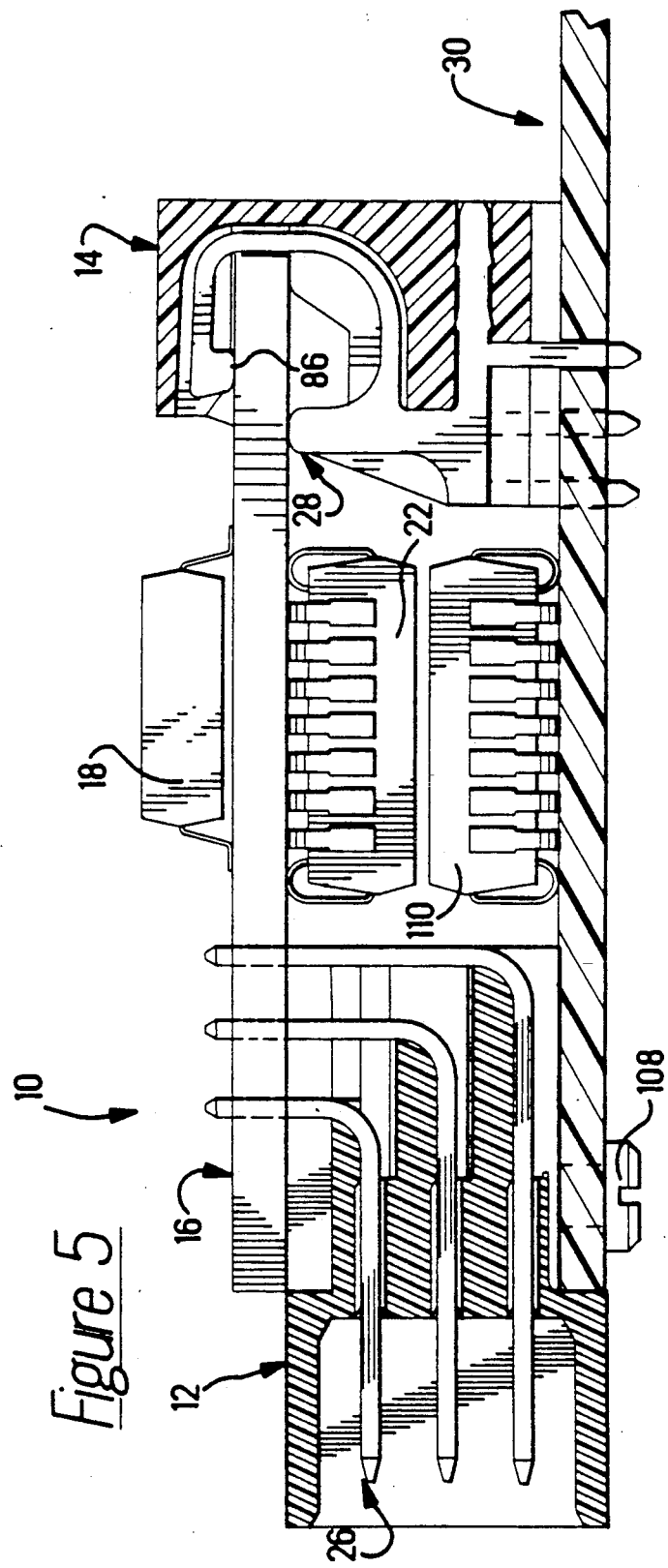
FIG. 5 is a side view of the assembly mounted on a circuit board.

With reference to FIGS. 4 and 5, unit 100 joins receptacle 14 to form assembly 10 by inserting card edge 16b into contact elements 28. Edge 16b is slid in between spring arm 76 and fulcrum 88 with unit 100 at an angle to board 30 as shown in FIG. 4. With edge 16b riding on ramp 70 on cam walls 62, unit 100 is pivoted towards board 30 on fulcrum 88. As card edge 16b moves up beyond ramp 70, unit 100 is further inserted into elements 28 so the card 16 rests on cam wall surface 72 as shown in FIG. 5. With unit 100 fully pivoted, pin header 12 abuts board 30, which enters recess 42, and is secured by fasteners such as bolt 108. During the pivoting motion, spring arms 76 are resiliently cammed outwardly to generate a high normal force between contact surfaces 86 and the engaging circuits (not shown) on card 16.

Unit 100 may be readily removed by freeing header 12 from board 30 and withdrawing it from receptacle 14. Thus the replacement of unit 100 or of the electronic components 18,22 are quickly and easily accomplished.

Active connector assembly 10 permits the use of the space of board 30 between header 12 and receptacle 14 for mounting electronic components 110 as shown in FIGS. 1, 4 and 5. That is, card 16 and components 22 mounted on surface 24 thereof are spaced above board 30 enough to allow the utilization of the underlying space. In this regard, card 16 may be made as long as desired without sacrificing any additional real estate on board 30.

As can be discerned, an active connector assembly has been disclosed. The assembly includes a receptacle for mounting on a circuit board and a unit consisting of a pin header and circuit card which is removably inserted into the receptacle. The circuit card may carry electronic components which will act on signals flowing between the circuit board and other data handling systems through the receptacle and pin header.

One advantage of the disclosed active connector assembly is the quick and easy replacement of the unit and the electronic components on the card. Another advantage is that the design of the assembly permits use of board space which otherwise might be needed by other known active connectors. Still another advantage of the disclosed active connector assembly is that the contact elements in the receptacle which engage circuits on the card are resiliently deformed during the mounting of the unit so that high normal forces are generated to insure reliable electrical contacts.

I claim:

1. An active connector assembly mountable to a circuit board and including a plurality of circuits concluding in a respective plurality of first contact sections defining a first contact array and engageable with corresponding contact means of corresponding electrical circuits of the board when mounted, and further concluding in a connector matable with a corresponding connector, for interconnecting the corresponding connector and the circuit board, the active connector assembly comprising:

a receptacle housing having secured therein a like plurality of first contact elements including respective said first contact sections at least exposed along a mounting face of said receptacle, said receptacle housing including a second face substantially orthogonal to said mounting face, said second face defining a card edge receiving cavity extending thereinto with second contact sections of said first contact elements exposed within said cavity, said second contact sections being C-shaped with openings facing said second face and coaligned to define an array adapted to receive a card edge into said openings for electrically connecting said second contact sections with respective conductive pads along said first edge of said circuit card;

a second connector including a plurality of second contact elements contained therewithin, said second connector including mounting means along a mounting face thereof enabling disconnectable fastening to the circuit board, and said second contact elements having third contact sections exposed along a mating face thereof for mating with corresponding contact means of a mating connector, said second contact elements extending to fourth contact sections exposed along a third face thereof; and a circuit card to interconnect said receptacle connector and said second connector and including an array of first circuits extending from conductive pads on at least one major surface along a first edge of said circuit card to an intermediate region and an array of second circuits extending to said intermediate region from a connector-proximate region remote from said first edge, said conductive pads being arrayed to become electrically connected with said C-shaped second contact sections of said receptacle upon insertion of said first edge thereinto, said circuit card being secured to said second connector at said connector-proximate region with said second circuits electrically connected to said fourth contact sections of said second contact elements of said second connector, and said circuit card being adapted to receive at least one electronic component mounted thereon at said intermediate region to electrically connect said first and second circuits for acting on electrical signals passing between said first and second circuits, whereby circuits between the mating connector and the circuit board are modifiable by an easily replaceable electronic component not mounted directly on the circuit board, by said electronic component being removably securable to said circuit card and said circuit card being removably securable to said circuit board upon unfastening of said second connector from said circuit board.

2. An active connector assembly as set forth in claim 1 wherein said mounting faces of said receptacle connector and said second connector are spaced substantially equal distances in a common direction from respective connections with said circuit card, whereby said circuit card is disposed a height from said circuit board minimizing interference with placement thereunder of other components mounted to the circuit board.

3. An active connector assembly as set forth in claim 1 wherein said first contact elements include fulcrum means spaced from and facing card-engaging surfaces of said first contact elements in said receptacle, said fulcrum means providing a point about which said circuit card may be pivoted during insertion into said receptacle.

4. An active connector assembly as set forth in claim 1 wherein said circuit card includes electronic components mounted thereon for acting on electrical signals being transmitted through said circuit card from said mating connector to said circuit board.

5. An active connector assembly as set forth in claim 1 wherein said second connector is a pin header.

* * * * *